(12) United States Patent
Tang et al.

(10) Patent No.: US 11,621,713 B2
(45) Date of Patent: *Apr. 4, 2023

(54) HIGH-SPEED CORE INTERCONNECT FOR MULTI-DIE PROGRAMMABLE LOGIC DEVICES

(71) Applicant: Intel Corporation, Santa Clara, CA (US)

(72) Inventors: Lai Guan Tang, Tanjung Bungah (MY); Ankireddy Nalamalpu, Portland, OR (US); Dheeraj Subbareddy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/408,129

(22) Filed: Aug. 20, 2021

(65) Prior Publication Data

US 2021/0384911 A1 Dec. 9, 2021

Related U.S. Application Data

(63) Continuation of application No. 16/882,037, filed on May 22, 2020, now Pat. No. 11,128,301, which is a
(Continued)

(51) Int. Cl.
| | | |
|---|---|---|
| *H03K 19/177* | (2020.01) | |
| *H01L 25/065* | (2006.01) | |
| *H03K 19/17704* | (2020.01) | |
| *H03K 19/17724* | (2020.01) | |
| *H03K 19/1776* | (2020.01) | |

(Continued)

(52) U.S. Cl.
CPC ....... *H03K 19/17704* (2013.01); *G06F 30/30* (2020.01); *G06F 30/32* (2020.01); *G06F 30/34* (2020.01); *H01L 25/0652* (2013.01); *H01L 25/0655* (2013.01); *H01L 25/0657* (2013.01);
(Continued)

(58) Field of Classification Search
CPC ..... H01L 2224/48227; H01L 23/49827; H01L 2924/15311; H01L 2225/06513; H01L 2225/06541; H01L 2225/06517; H01L 25/0652; H01L 25/0657; H01L 2224/0401; H01L 24/16; H01L 2224/73265; H01L 23/49838; H01L 25/0655; H01L 2224/13025; H01L 2924/14; H01L 2225/06544; H01L 23/481; H01L 2924/014; H01L 2224/16227; H01L 2224/05001; H01L 2224/05009; H01L 2225/1058; H01L 2924/15331; H01L 2224/04042; H03K 19/17744; H03K 19/17764; H03K 19/17728; H03K 19/17736; H03K 19/1736; H03K 19/177; G06F 30/30; G06F 30/32; G06F 30/34
See application file for complete search history.

(56) References Cited

U.S. PATENT DOCUMENTS 6,911,730 B1 6/2005 New
7,073,154 B1 7/2006 Garrison et al.
(Continued)

*Primary Examiner* — Vibol Tan
(74) *Attorney, Agent, or Firm* — Fletcher Yoder, P.C.

(57) ABSTRACT

Systems and methods related to multi-die integrated circuits that may include dies having high-speed core interconnects. The high-speed core interconnects may be used to directly connect two adjacent dies.

20 Claims, 3 Drawing Sheets

Related U.S. Application Data continuation of application No. 16/236,062, filed on Dec. 28, 2018, now Pat. No. 10,666,261.

(51) Int. Cl.
*H03K 19/17736* (2020.01)
*G06F 30/30* (2020.01)
*G06F 30/32* (2020.01)
*G06F 30/34* (2020.01)

(52) U.S. Cl.
CPC ... *H03K 19/1776* (2013.01); *H03K 19/17724* (2013.01); *H03K 19/17736* (2013.01)

(56) References Cited

U.S. PATENT DOCUMENTS

| | | |
|---|---|---|
| 8,890,562 B1 | 11/2014 | Hartanto |
| 9,041,409 B1 | 5/2015 | Look |
| 9,077,338 B1 | 7/2015 | Schulz et al. |
| 9,106,229 B1 | 8/2015 | Hutton et al. |
| 9,461,837 B2 | 10/2016 | Baeckler |
| 10,310,868 B2 | 6/2019 | Linsky |
| 10,666,265 B2 * | 5/2020 | Clark ................ H03K 19/1776 |
| 10,886,218 B2 * | 1/2021 | Teh ..................... H01L 23/5382 |
| 2014/0049932 A1 | 2/2014 | Camarota |
| 2014/0264783 A1 | 9/2014 | Liu et al. |
| 2016/0124899 A1 | 5/2016 | Vasishta et al. |
| 2018/0041328 A1 | 2/2018 | Patil et al. |
| 2019/0044520 A1 | 2/2019 | Tang et al. |
| 2019/0050361 A1 | 2/2019 | Raghava et al. |
| 2019/0158096 A1 | 5/2019 | Tang et al. |
| 2019/0206798 A1 | 7/2019 | Collins et al. |
| 2019/0220566 A1 | 7/2019 | Tang et al. |

* cited by examiner

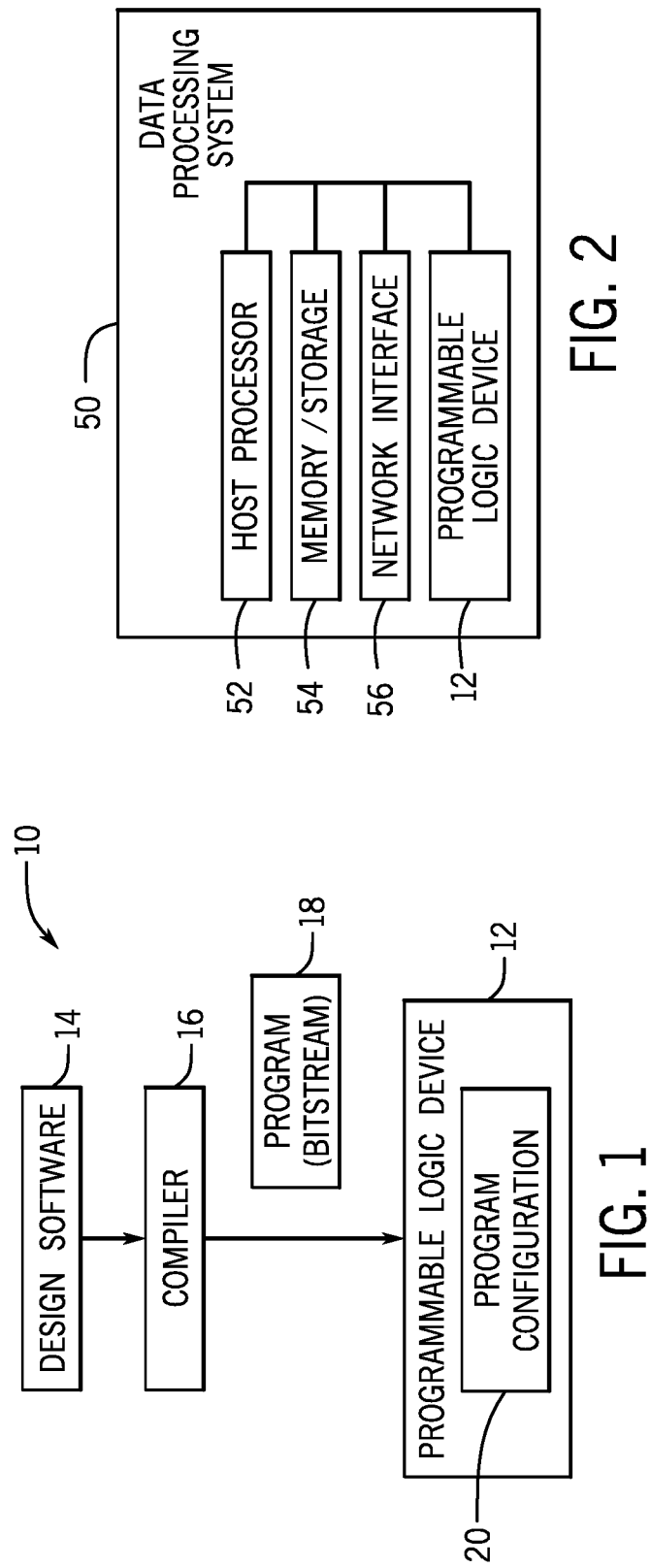

HIGH-SPEED CORE INTERCONNECT FOR MULTI-DIE PROGRAMMABLE LOGIC DEVICES

CROSS-REFERENCE TO RELATED APPLICATIONS

This application is a continuation of U.S. patent application Ser. No. 16/882,037, entitled, "HIGH-SPEED CORE INTERCONNECT FOR MULTI-DIE PROGRAMMABLE LOGIC DEVICES," filed May 22, 2020, which is a continuation of U.S. patent application Ser. No. 16/236,062, entitled "HIGH-SPEED CORE INTERCONNECT FOR MULTI-DIE PROGRAMMABLE LOGIC DEVICES," now U.S. Pat. No. 10,666,261, filed Dec. 28, 2018, which is hereby incorporated by reference in its entirety for all purposes.

BACKGROUND

This disclosure relates to interconnect circuitry in multi-die integrated circuit devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed that may be programmed to perform custom operations or to implement a circuit design. To program custom operations and/or circuit design into a programmable logic device, the circuit design may be compiled into a bitstream and programmed into configuration memory in the programmable logic device. The values programmed using the bitstream define the operation of programmable logic elements of the programmable logic device.

Certain functions programmed in a programmable logic device may involve data transfers between different regions of the programmable logic device. As a result, the data transfers may be subject to latencies that may limit the speed of operation of these functions. As programmable logic devices are used in more applications, demand for bigger and more complex devices have been increasing. Modern devices with bigger and/or multi-die packages may cause challenges in the circuit design to perform timing closure.

BRIEF DESCRIPTION OF THE DRAWINGS

Various aspects of this disclosure may be better understood upon reading the following detailed description and upon reference to the drawings in which:

FIG. 1 is a block diagram of a programmable logic device that is programmed with a circuit design, in accordance with an embodiment;

FIG. 2 is a block diagram of an electronic system that may use a programmable logic device to provide accelerated data processing capabilities, in accordance with an embodiment;

DETAILED DESCRIPTION OF SPECIFIC EMBODIMENTS

Figure 3:
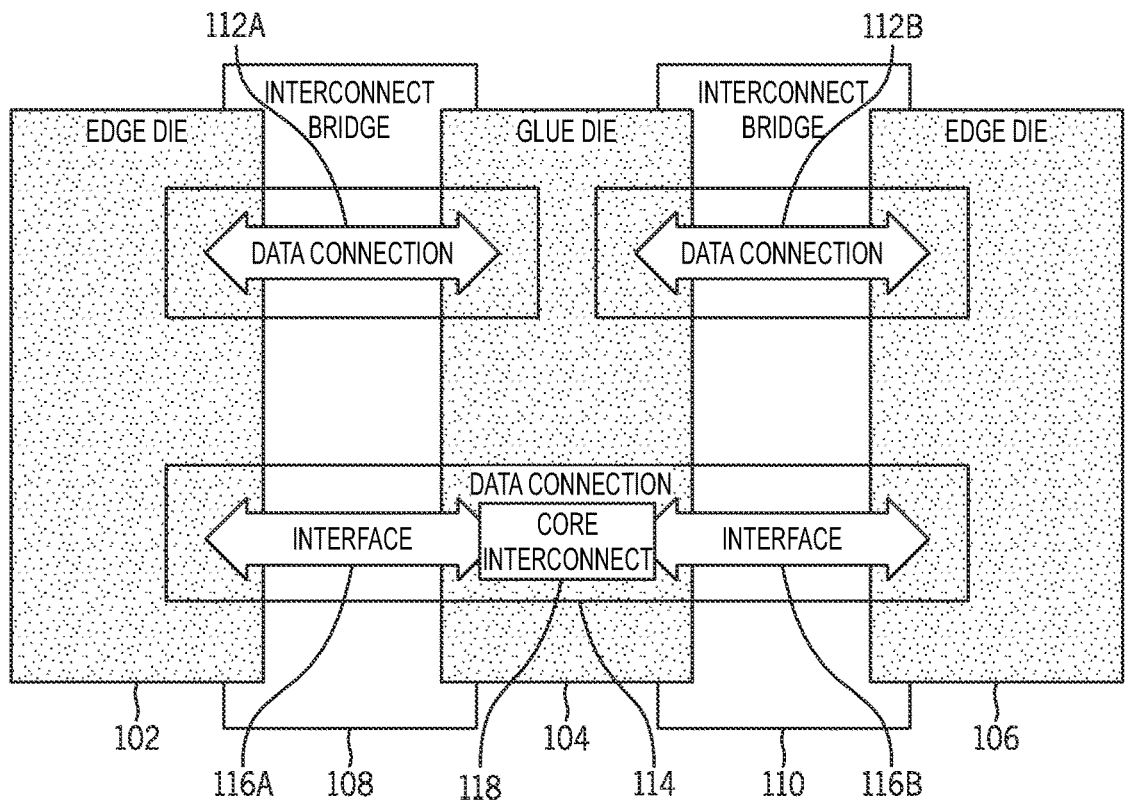
FIG. 3 is a block diagram of multi-die programmable logic device that may include a programmable logic die having a high-speed core interconnect, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. The increase in the size and complexity of systems that may employ programmable logic devices may lead to an increase in the demand for programmable fabric resources. In order to obtain larger devices, and in view of potential production yield limitations, certain programmable logic devices may be formed from multiple programmable logic dies connected via bridge circuitry (e.g., multi-die programmable logic devices, multi-die field programmable gate arrays (FPGAs) devices).

To implement circuit designs in programmable logic fabric, different sectors, portions, or regions of a programmable logic device may perform different portions of an operation on data, and coordination may employ exchanges between these regions. The latencies in the data exchanges may be a challenge in the design of some circuit designs, as they may limit the speed of operation. For example, some applications of FPGAs, such as the emulation of application-specific integrated circuits (ASICs), may have specification for operating frequency, and the resulting timing constraints may limit the use of multi-die devices. Moreover, in some situations, the latency may be variable or indeterminate (e.g., indeterminate within a tolerance), which may make the timing closure (e.g., the design of the timing circuitry associated with the circuit design) challenging.

Embodiments described herein are related to programmable logic devices, electronic systems including programmable logic devices, and methods of operation thereof, which may provide reduced latency in data transfers between sectors in different dies of multi-die programmable logic devices. To that end, programmable fabric dies including high-speed core interconnects may be used in the multi-die programmable logic device. In some embodiments, the die with the high-speed core interconnect may be used to provide high-speed data transfers between two adjacent dies. The high-speed core interconnect may employ dedicated interconnect lines, which may be in a high metal layer. The electrical properties of the dedicated interconnect line (e.g., a core interconnect) may be adjusted to improve the communication performance. For example, the core interconnect may be designed to have resistance-capacitance (RC) characteristics appropriate for longer distances. In some embodiments, the core interconnect may include drivers and/or repeating circuitry to provide reliable communication.

By way of introduction, FIG. 1 illustrates a block diagram of a system 10 that may employ a programmable logic device 12 that may be a multi-die programmable logic device having a programmable logic die with a high-speed core interconnect. Using the system 10, a designer may implement a circuit design functionality on an integrated circuit, such as the reconfigurable programmable logic device 12, (e.g., an FPGA). The designer may implement the circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by bitstream 18, sometimes known as a program object file and/or configuration program, which programs the programmable logic device 12. In the process of compiling the bitstream 18, the design software may assign certain regions of the programmable logic device 12 to perform certain logic operations. The compiler 16 may provide, thus, configuration data representative of the circuit design to the programmable logic device 12 in the form of one or more bitstreams 18. The configuration program (e.g., bitstream) 18 may be programmed into the programmable logic device 12 as a configuration program 20. The configuration program 20 may, in some cases, represent an accelerator function to perform for machine learning, video processing, voice recognition, image recognition, or other highly specialized task To implement communication for data exchanges between different regions of the programmable logic device 12, the design software 14 may include in the bitstream 18, instructions for timing circuitry (e.g., clock trees), and instructions to clock the data transfers in the configuration program 20. Moreover, the compiler 16 and/or the design software 14 may also calculate timing constraints (e.g., timing margins, data transference margins) of the circuit design, and operating frequencies for operation of the configuration program 20 in the programmable logic device 12. As discussed above, the configuration program 20 associated with the program design may be distributed across multiple dies of the programmable logic device 12, and may include instructions for data transfers between sectors or regions located in different dies. In certain multi-die devices, the data transfers may traverse an entire die, as detailed below. In such situations, the bitstream 18 may include instructions that assign the data transfer to a high-speed interconnect of an intermediate die, to improve the timing characteristics (e.g., reduced latency, deterministic latency) in the data transfer.

During the design process, the design software 14 may provide tools to test and/or verify timing conditions. Examples of situations that may be tested include racing conditions, register-to-register timing margins, critical timing in data paths, and/or timing closure. To that end, the design software may employ a model of the timing resources available in the physical die. The clocking resources may include the core interconnects in the programmable die, which may be used to facilitate timing closure, as detailed below.

The programmable logic device 12 may be, or may be a component of, a data processing system 50, as shown in FIG. 2. The data processing system 50 may include a host processor 52, memory, storage circuitry 54, and a network interface 56. The data processing system 50 may include more or fewer components (e.g., electronic display, user interface structures, application specific integrated circuits (ASICs)). The host processor 52 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 50 (e.g., to perform machine learning, video processing, voice recognition, image recognition, data compression, database search ranking, bioinformatics, network security pattern identification, spatial navigation, or the like).

The memory and/or storage circuitry 54 may include random access memory (RAM), read-only memory (ROM), one or more hard drives, flash memory, or the like. The memory and/or storage circuitry 54 may be considered external memory to the programmable logic device 12 and may hold data to be processed by the data processing system 50 In some cases, the memory and/or storage circuitry 54 may also store configuration programs (bitstreams 18) for programming the programmable logic device 12. The network interface 56 may allow the data processing system 50 to communicate with other electronic devices. The data processing system 50 may include several different packages or may be contained within a single package on a single package substrate. In some embodiments, the data processing system 50 may include a multi-die device that may include a die (e.g., a glue die) that includes a high-speed core interconnect, as detailed below. The glue die with a high-speed core interconnect may be a glue die disposed between two adjacent dies and the high-speed core interconnect may be used to provide data transfer between the adjacent dies.

It should be understood that the glue die and/or the adjacent dies might be of any type, and may be for example, an application specific integrated circuit (ASIC) die, a programmable logic die, a memory die, an input/output (I/O) interface die (e.g., a peripheral component interface express (PCIe) die, an universal serial bus (USB) die, a memory controller die, or a die with transceiver circuitry), a processor die, or any other integrated circuit. For example, in some embodiments, the two adjacent dies and the glue die may be programmable dies. In some embodiments, the glue die may include programmable fabric, and one or both of the adjacent dies may be a memory or a processor die. In some embodiments, the glue die may be a hardened die (e.g., an I/O die) with a high-speed interconnect that couples two adjacent programmable dies. Moreover, it should be understood that the disclosures described herein can be used in multi-die devices with any number of dies, and with any number of glue dies having high-speed core interconnects to link two adjacent dies.

In one example, the data processing system 50 may be part of a data center that processes a variety of requests. For instance, the data processing system 50 may receive a data processing request via the network interface 56 to perform machine learning, video processing, voice recognition, image recognition, data compression, database search ranking, bioinformatics, network security, pattern identification, spatial navigation, or some other specialized task. The host processor 52 may cause the programmable logic fabric of the programmable logic device 12 to be programmed with a particular accelerator related to requested task. For instance, the host processor 52 may cause the configuration data (e.g., bitstream 18) to be stored on the storage circuitry 54 or cached in a memory of the programmable logic device 12 to be programmed into the programmable logic fabric of the programmable logic device 12 prior to operation. The configuration data (e.g., bitstream 18) may represent a circuit design for a particular accelerator function relevant to the requested task. Indeed, in one example, an accelerator may assist with a voice recognition task less than a few milliseconds (e.g., on the order of microseconds) by rapidly accessing and processing large amounts of data in the accelerator. In some embodiments, the programmable logic device 12 may be used as an ASIC emulator or as a drop-in replacement for ASIC circuitry. In such situation, the programmable logic device 12 may be subject to stringent timing specifications. The use of programmable logic dies with the core interconnect disclosed herein may be facilitate timing closures for the programmable logic devices.

FIG. 3 illustrates a programmable logic device 12 that may be packaged as multi-die devices. The programmable logic device 12 may include an edge die 102, a glue die 104, and an edge die 106. In the illustrated example, the edge dies 102 and 106 and the glue die 104 are programmable logic dies. It should be understood, however, that the disclosures provided herein are applicable to other types of devices, including ASIC dies and/or hybrid dies. The edge die 102 is coupled to the glue die 104 through a first interconnect bridge 108. The glue die 104 is coupled to the edge die 106 through a second interconnect bridge 110. The interconnect bridges 108 and 110 may be 2D interconnects, 2.5D interconnects and/or 3D interconnects. The interconnect bridges 108 and 110 may provide wide data interfaces between the dies 102, 104, and 106. In some embodiments, the bridges may be high-density microbump bridges having a large number of input/output (I/O) channels (e.g., 8 I/O channels, 16 I/O channels, 32 I/O channels, 64 I/O channels, 96 I/O channels, 128 I/O channels, 256 I/O channels) to connect the dies. It should be understood that each channel might have hundreds of physical wires (e.g., 100 wires per I/O channel, 125 wires per I/O channel, 150 wires per I/O channel, or 400 wires per I/O channel).

The interconnect bridges may be used to provide data transfers between neighboring dies. For example, the interconnect bridge 108 may provide a data connection 112A between the edge die 102 and the glue die 104. The data connection 112A may be used to, for example, allow data transfers between sectors in the edge die 102 and the glue die 104. Similarly, the interconnect bridge 110 may provide a data connection 112B between the edge die 106 and the glue die 104. The data connection 112B may be used to, for example, allow data transfer between sectors in the edge die 106 and the glue die 104. The data connections 112A and 112B may also be used to provide data transfers between sectors in the edge die 102 and in the edge die 106. In such situations, the latency in the data transfer may be large, as the communication may be routed through a portion of the programmable logic fabric of the glue die 104.

In situations where a low latency and/or a deterministic latency may be suitable for data transfers between sectors in the edge die 102 and in the edge die 106, the programmable logic device 12 may employ a data connection 114. The data connection 114 may directly connect the two adjacent edge dies 102 and 106 without routing data into the programmable fabric of the glue die. The data connection 114 may include the interface 116A of the interconnect bridge 108, the interface 116B of the interconnect bridge 110, and the core interconnect 118. The core interconnect 118 may provide a dedicated interconnect between the interfaces 116A and 116B through the glue die 104, as detailed below. In some embodiments, the I/O data channels in the interconnect bridges 108 and 110 may be dedicated. For example, the interconnect bridge 108 may have 96 I/O channels, of which 64 I/O channels may be assigned to data connection 112A and 32 I/O channels may be assigned to the interface 116A of the data connection 114. It should be understood that the above-described division of I/O channels is merely illustrative and other I/O channel distributions may be used, based on the application.

Moreover, in some embodiments, a portion or all of the I/O data channels may be shared in the interconnect bridges 108 and 110. For example, the interconnect bridges 108 may have 96 configurable I/O channels that may be dynamically assigned to the data connection 112A and/or to the interface 116A. For example, the interconnect bridges 108 may have 96 I/O channels, of which 32 I/O channels may be assigned to data connection 112A and the remaining 64 I/O channels may be configurably assigned to data connection 112A or to the interface 116A. The I/O channels may include multiplexing and/or demultiplexing circuitry in the glue die 104 to perform the configuration. For example, a multiplexer in the glue die 104 may configurably route data coming from the interface 116A to the core interconnect 118 or to the programmable fabric in the glue die 104. Multiplexing circuitry may also be used in the edge dies 102 and/or 106 to perform configuration. In some embodiments, the number of I/O channels of the interconnect bridge 108 that are assigned to the core interconnect 118 may be the same as the number of I/O channels of the interconnect bridge 110 assigned to the core interconnect 118.

Figure 4:
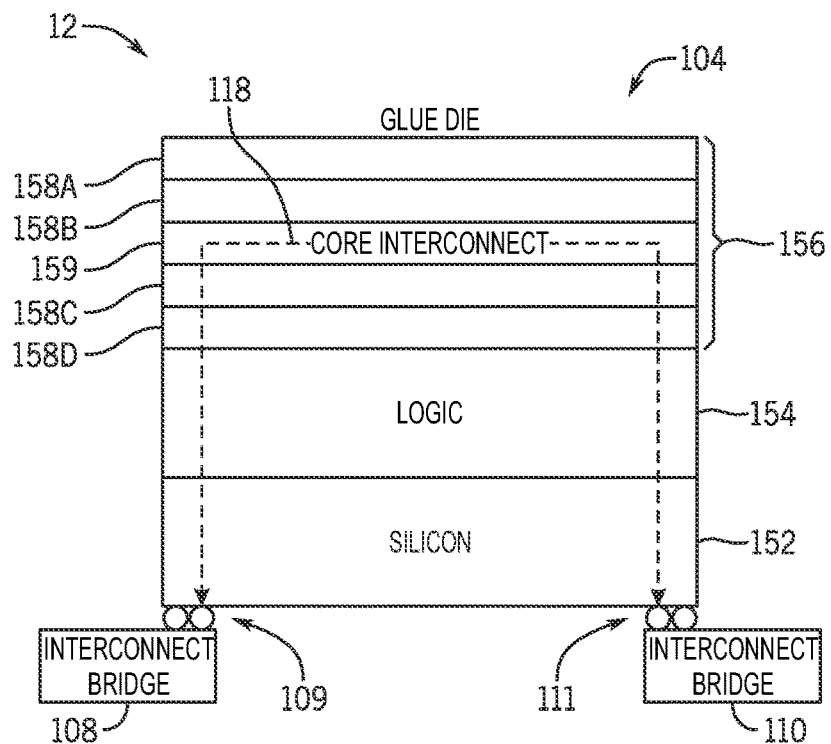
FIG. 4 is a front view of a programmable logic die having a high-speed core interconnect, in accordance with an embodiment.

FIG. 4 provides a schematic front view of an embodiment of a glue die 104 of a programmable logic device 12 having core interconnect 118. The glue die 104 may have a substrate layer 152, a programmable fabric layer 154, and interconnect metallization 156. The substrate layer 152 may include external connections for coupling with other devices, such as the interconnect bridges 108 and 110. As illustrated, the connection between interconnect bridge 108 and the glue die may be performed through a microbump interface 109 and the connection between the interconnect bridge 110 and the glue die 104 may be performed through a microbump interface 111. The programmable fabric layer 154 may include multiplexing circuitry, gating circuitry, and/or memory circuitry that implement logic array blocks (LABs), look-up tables (LUTs), configuration memory (CRAM), and other programmable fabric circuitry.

The interconnect metallization 156 may include one or more interconnect layers, such as layers 158A, 158B, 158C, 158D, and 159. The interconnect layers 158A, 158B, 158C, 158D, and 159 may include hardened data buses that may be used to create routes between different sectors or regions of the programmable fabric layer 154. The hardened data buses may be coupled to routing circuitry (e.g., multiplexing circuitry) that allows dynamic reconfiguration of the routes. In the illustrated system, layer 159 may include a core interconnect 118. The core interconnect 118 may provide a high-speed data bus that traverses the entire glue die. Accordingly, the core interconnect 118 may couple the interface 109 to the interface 111. In some embodiments, the metallization of the layer 159 may be adjusted to provide low or matched impedance between the interface 109 and 111 to minimize electrical losses. In some embodiments, the layer 159 may include repeaters and/or drivers that may be decrease electrical performance losses, as detailed in FIG. 5. In some embodiments, the core interconnect 118 may be formed by data buses in more than a single layer (e.g., layer 158B and 159, layers 158A and 159, all the layers 158A, 158B, 158C, 158D, and 159). In some embodiments the layer 159 may have a portion assigned to the core interconnect 118 and a second portion assigned to routing between different sectors or regions of the programmable fabric layer 154.

Figure 5:
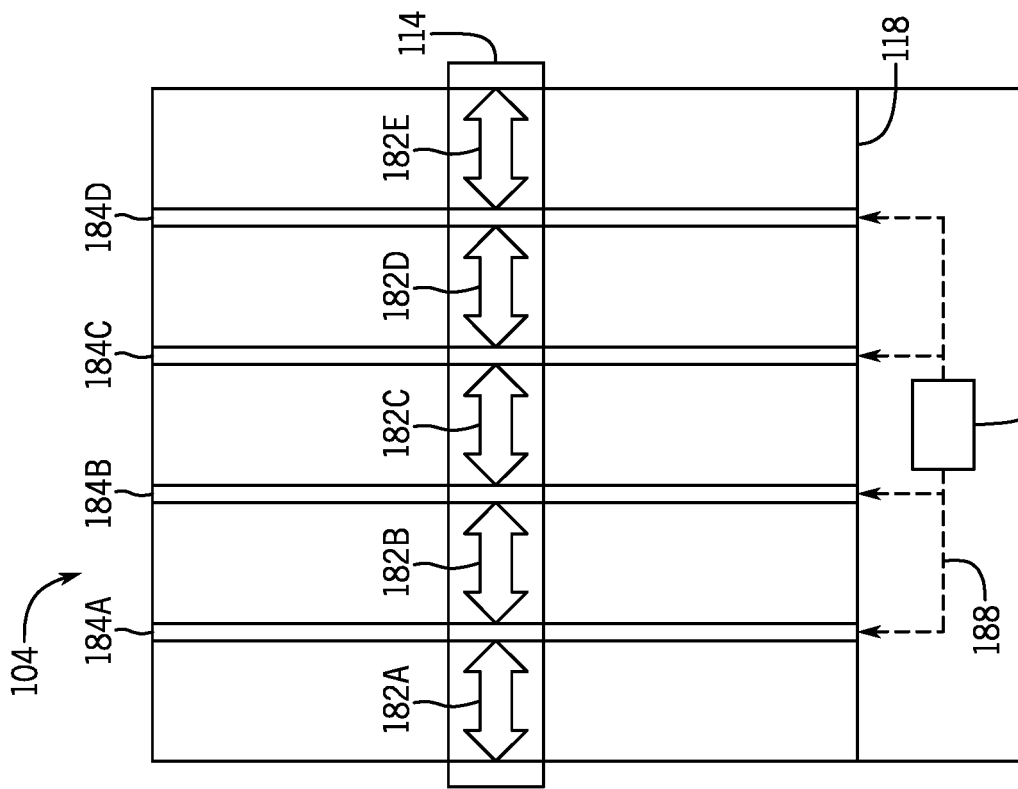
FIG. 5 is a top view of a programmable logic die having a high-speed core interconnect, in accordance with an embodiment.

FIG. 5 provides a schematic top view of the glue die 104, illustrating the core interconnect 118. The core interconnect 118 may be in a high metal layer (e.g., metal layer 159 of FIG. 4). As discussed above, the core interconnect 118 may be used to provide a data connection 114 that traverses the glue die 104, and may communicatively couple adjacent dies (e.g., edge die 102 and 104). The core interconnect 118 may include one or more repeaters 184A, 184B, 184C, and 184D. The repeaters 184A-D may be use to provide a high-speed performance and/or minimize losses along the core interconnect 118. In the illustrated system, the repeater 184A may have a connection 182A with an interface that may be in the edge of the glue die 104 (e.g., interface 109 of FIG. 4). The repeaters 184A, 184B, and 184C may have connections 182B, 182C, and 182D with repeaters 184B, 184C, and 184D, respectively. In the illustrated system, the repeater 184D may have a connection 182E with an interface that may be in the edge of the glue die 104 (e.g., interface 111 of FIG. 4). Each repeater 184A, 184B, 184C, and 184D may have an amplifying circuitry to mitigate signal losses. In some embodiments, the repeaters 184A, 184B, 184C, and 184D may have memory circuitry to implement queues (e.g., first-in-first-out (FIFO) queues) to prevent data losses in a potential congestion. In some embodiments, the core interconnect 118 may have a single repeater (e.g., one repeater in the center of the core interconnect 118), or two repeaters (e.g., one repeater in each edge of the glue die 104). In some embodiments, the core interconnect 118 may be a transmission line with no repeaters.

The separation between the repeaters 184A-D and/or the number of repeaters 184A-D along the core interconnect employed may be based on the electrical properties of the data bus (e.g., RC characteristics, impedance), and/or the quality of the signal (e.g., voltage levels, current levels). In some embodiments, the spacing between repeaters 184A-D may be in a range between 350 μm and 400 μm. Other separation distances, such as for example 100 μm, 200 μm, 500 μm, or 1 mm, may be employed, based on the characteristics of the data bus of core interconnect 118 and/or of the repeater 184A-D. For example, if a glue die has dimension 32×20 mm and the extension of the core interconnect 118 is, thus, of approximately 20 mm, the number of repeaters employed may be in a range between 50 and 60 repeaters. In such a system, the latency of the data connection 114 may be smaller than 5 ns. Such latency may be substantially smaller than a latency for a data communication link that goes through the programmable fabric of the glue die 104, which may be larger than 10 ns. In some embodiments, the repeaters 184A-D may be configured by control circuitry 186 of the glue die 104. The control circuitry 186 may provide commands 188 to adjust the power of the repeaters 184A-D. As such, control circuitry 186 may be used to reduce power consumption in the glue die 104 when the core interconnect 118 is idle.

Figure 6:
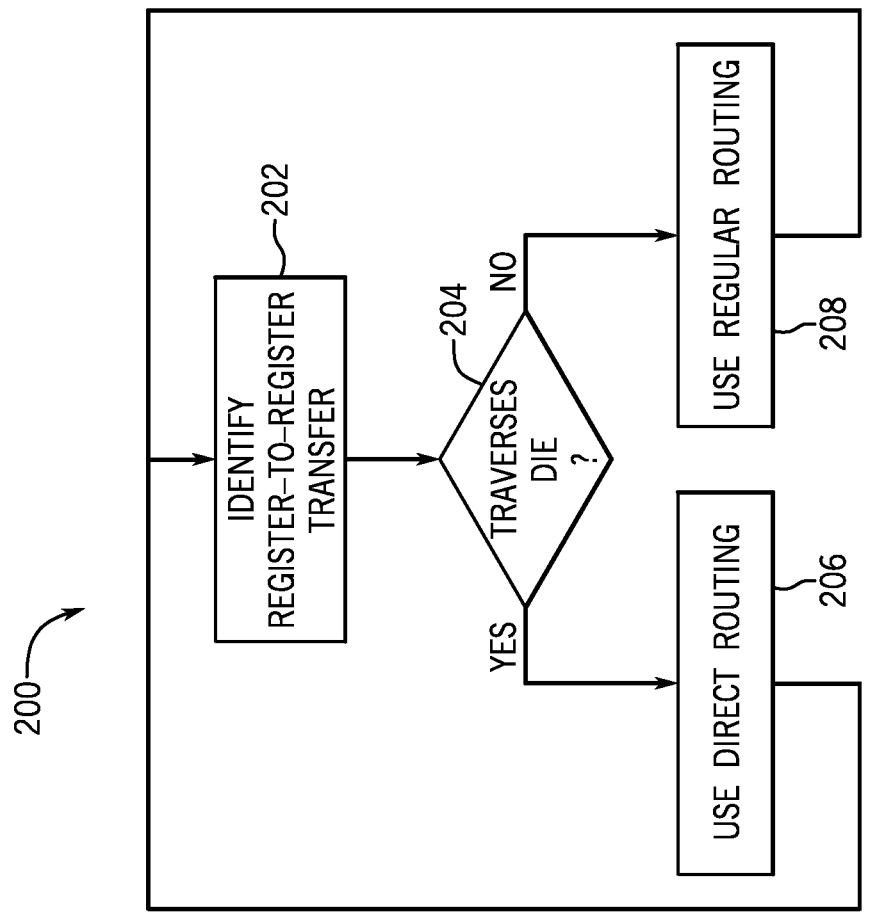
FIG. 6 is a flowchart of a method to assign data transfers to a high-speed core interconnect, in accordance with an embodiment.

With the foregoing in mind, FIG. 6 illustrates a method 200 that may be used by a software (e.g., design software 14 of FIG. 1, compiler 16 of FIG. 1) to assign data transfers to a core interconnect 118, when producing configuration data for a multi-die devices, as discussed above. The method 200 may be used during the synthesis of a circuit design to configuration data (e.g., configuration program 20 of FIG. 1). During the synthesis process, a data transfer (e.g., register-to-register data transfer) may be identified for routing in process block 202. The data transfer may have a source region or sector and a destination region or sector. In a decision block 204 of method 200, the system may deter determine whether the routing between the source region and destination regions traverses a die. As an example based on FIG. 3, the source region may be in edge die 102, the destination region may be in an edge die 106 and, as a result, the routing between the source region and the destination region may traverse the glue die 104. If the routing traverses a die and the die includes a core interconnect 118, a direct routing via the core interconnect may be assigned to the data transfer in process block 206. If the routing does not traverse the die, regular routing may be assigned in process block 208. In some situations, the amount of data transfers that are expected to traverse a glue die may exceed the number of available channels in the core interconnect 118. In such situation, the method 200 may employ priorities for each data transfers based on timing specifications of the circuit design, and may assign some data transfers to the core interconnect 118. The remaining data transfers may be routed through programmable fabric of the glue die 104.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]in [a function] . . . " or "step for [perform]ing [a function] . . . ," it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A programmable logic device comprising:
    a first die;
    a second die; and
    a third die coupled to the first die through a first interface and coupled to the second die through a second interface, wherein the first interface, the second interface, or both comprise a microbump interface, wherein the third die is coupled to a plurality of interconnect layers, wherein the plurality of interconnect layers comprise one or more hardened data buses used to create one or more routes between different regions of a programmable fabric layer of the third die.

2. The programmable logic device of claim 1, wherein at least one interconnect layer of the plurality of interconnect layers comprises the first interface, the second interface, and a core interconnect.

3. The programmable logic device of claim 1, wherein the first interface is configured to be coupled to the second interface via a core interconnect.

4. The programmable logic device of claim 3, wherein the core interconnect comprises a plurality of repeaters.

5. The programmable logic device of claim 4, wherein the plurality of repeaters comprise a separation in a range between 350 microns and 400 microns.

6. The programmable logic device of claim 1, wherein the first interface, the second interface, and a core interface between the first interface and the second interface are used for one or more data transfers between the first die and the second die.

7. The programmable logic device of claim 6, wherein the one or more data transfers are routed between the first die and the second die by traversing the third die.

8. The programmable logic device of claim 6, wherein the one or more data transfers are routed between the first die and the second die without traversing the third die.

9. The programmable logic device of claim 1, wherein the first die, second die, or both comprise programmable logic.

10. The programmable logic device of claim 1, wherein the third die comprises an input/output die that comprises transceiver circuitry.

11. A system, comprising:
    a host processor; and
    a programmable logic device communicatively coupled to the host processor, the programmable logic device comprising:
        a first die coupled to a programmable die via a first interface; and
        a second die coupled to the programmable die via a second interface, wherein the first interface, second interface, or both comprise a plurality of microbump bridges, wherein the programmable die is coupled to a plurality of interconnect layers, wherein the plurality of interconnect layers comprise one or more hardened data buses configured to dynamically reconfigure one or more routes in a programmable fabric layer of the programmable die.

12. The system of claim 11, wherein the host processor is configured to assign priority to a data transfer between the first die and the second die based on determining that the data transfer traverses the programmable die.

13. The system of claim 11, wherein the host processor is configured to assign priority to a data transfer between the first die and the second die based on determining that the data transfer does not traverse the programmable die.

14. The system of claim 11, wherein at least one interconnect layer of the plurality of interconnect layers comprises the first interface, the second interface, and a core interconnect.

15. The system of claim 11, wherein the first interface is configured to be coupled to the second interface via a core interconnect.

16. The system of claim 15, wherein the core interconnect comprises a plurality of repeaters.

17. A method, comprising:
    determining a data transfer between a first die of a programmable logic device and a second die of the programmable logic device through a third die of the programmable logic device, wherein the third die is coupled to the first die through a first interface and coupled to the second die through a second interface, wherein the third die comprises a core interconnect that couples the first interface and the second interface, wherein the core interconnect comprises a plurality of repeaters, and wherein the third die comprises a hardened data bus used to create a route between different regions of a programmable fabric layer of the third die;
    assigning a portion of the core interconnect of the third die to the data transfer;
    generating a bitstream comprising the portion of the core interconnect of the third die assigned to the data transfer; and
    configuring the programmable logic device using the bitstream.

18. The method of claim 17, wherein the first interface, the second interface, or both comprise a microbump interface.

19. The method of claim 17, comprising assigning priority to one or more data transfers between the first die and the second die in response to a number of the one or more data transfers exceeding available number of data channels in the third die.

20. The method of claim 17, wherein the third die comprises an input/output die that comprises transceiver circuitry.

* * * * *